United States Patent
Schneider et al.

(10) Patent No.: US 8,411,107 B2
(45) Date of Patent: Apr. 2, 2013

(54) ADAPTIVE SNAPPING

(75) Inventors: Kevin Schneider, Portland, OR (US); Nivedita Barve, Pune (IN)

(73) Assignee: Autodesk, Inc., San Rafael, CA (US)

( * ) Notice: Subject to any disclaimer, the term of this patent is extended or adjusted under 35 U.S.C. 154(b) by 845 days.

(21) Appl. No.: 12/543,329

(22) Filed: Aug. 18, 2009

(65) Prior Publication Data
US 2011/0043517 A1    Feb. 24, 2011

(51) Int. Cl.
*G09G 5/26*    (2006.01)
(52) U.S. Cl. .................................................. 345/619
(58) Field of Classification Search .................. 345/619
See application file for complete search history.

(56) References Cited

U.S. PATENT DOCUMENTS

| | | | |
|---|---|---|---|
| 6,072,903 A * | 6/2000 | Maki et al. ............... | 382/190 |
| 7,675,520 B2 * | 3/2010 | Gee et al. ................. | 345/473 |
| 8,077,981 B2 * | 12/2011 | Elangovan et al. ........ | 382/209 |
| 2009/0066784 A1 * | 3/2009 | Stone et al. .............. | 348/47 |
| 2010/0145665 A1 * | 6/2010 | Mujtaba et al. ........... | 703/1 |

OTHER PUBLICATIONS

Ken Xu—2001 "Automatic Object Layout Using 2D Constraints and Semantics".*

* cited by examiner

*Primary Examiner* — Javid A Amini
(74) *Attorney, Agent, or Firm* — Gates & Cooper LLP

(57) ABSTRACT

A computer implemented method, apparatus, system, article of manufacture, and computer readable storage medium provide the ability to position/manipulate an object in a computer drawing application. A drawing model having a snap option and a first zoom level is displayed. The snap option that enables a positioning of an object in alignment with grid lines by causing the object to automatically jump to an exact position when the object is moved to within a first snap distance of the exact position. A zoom operation changes the first zoom level to a second zoom level. Automatically, dynamically, and independently from additional user actions, the first snap distance is recalculated based on the second zoom level.

21 Claims, 7 Drawing Sheets

ADAPTIVE SNAPPING

BACKGROUND OF THE INVENTION

1. Field of the Invention

The present invention relates generally to computer graphics drawing applications, and in particular, to a method, apparatus, and article of manufacture for automatically and dynamically adjusting a snap increment.

2. Description of the Related Art

When working in a drawing/drafting application (e.g., a computer aided design [CAD]), users often want to place or draw objects at specific locations or of specific sizes. To assist in such drawing/drafting, many applications provide and display a grid consisting of a network of uniformly spaced horizontal and perpendicular lines. Such applications may then provide for snapping that allows an object to be easily positioned in alignment with grid lines, guide lines, or another object, by causing it to automatically jump to an exact position when the user drags it to the proximity of the desired location. A snap can be associated with a grid such that when placing or drawing an object, the object/geometry snaps to a particular vertex of the grid, thereby creating lines/objects that are both in a desired direction (e.g., a geometrically straight line) and of a desired distance (e.g., by snapping in exact increments). However, setting up and working with the grid and snap is often a manual process. Further, when zooming in/and out of a drawing, the prior art fails to provide a mechanism for adjusting the snap. Such problems may be more easily understood with an explanation of prior art snapping methodologies.

Prior art applications currently provide a standard (default) snap distance or grid size, and allow users to set or adjust the snap distance to aid drawing and modifying designs with precision. Setting and modifying the snap setting is a manual process:

- Users have no indication of the size of a design and what units the design is in while they are working on the model;
- Depending on the size of a design the user must change the snap to an appropriate increment;
- Depending on the unit system, inches or mm for example, the user must change the snap to an appropriate increment;
- Depending on how far in or out a design is viewed (zoom factor), different snap values are appropriate; and
- Users often need to leave the design window in order to simply view what the snap increment is.

Manual changes to a snap increment requires that the user understand where the snap settings are stored, how to make changes, and to know what an appropriate snap value should be. For new users or occasional users this can be a difficult process. For experienced users this can take time and focus away from the primary task of creating or modifying the design.

To more fully understand grids and snapping, an example is useful. A designer/architect may be drawing a line that must be of a specific length (e.g., a house must be exactly 8.5 feet or an engine block for a car must be 36 inches or 45 mm). Accordingly, as a design and drawing is modified, a certain amount of precision and scale is required for the design to be accurate. Prior art techniques allow the user to set a grid snap that defines the grid and snap distance that allows the user to snap the line to a grid vertex thereby establishing a defined distance rather than a line being infinitely variable in length. For example, as a line is drawn, it snaps to an increment. If the increment is 1 inch, the line being drawn will have a length that progresses from 1 inch, to 2 inches, to 3 inches, etc., up to the desired amount.

Problems arise in the prior art when users are working in the same drawing at different levels of zoom. For example, users may often be working with one line that is 2 mm long (e.g., when working with a mobile phone circuit) and another line that is 2 miles long (e.g., when working with a construction site or satellite design). In such a situation, the user is required to change the snap settings often by zooming in, manually changing the grid snap (e.g., to mm), then zooming out and changing the grid snap once again (e.g., back to miles). Such prior art solutions force users to spend an inordinate amount of time configuring software options to obtain logical behavior for snapping at various levels of zoom. Further, when designers require accurate/exact measurements, the prior art forces users to undertake complex manual operations.

Some prior art methods may provide an adaptive grid that readjusts so that the grid is not overly dense when a user zooms in/out. However, what such a technology provides is merely a visual adjustment that refrains from drawing lines when the lines begin to blend together during a zoom operation (e.g., as the user zooms out, lines appear closer together and more dense). Further, such a prior art mechanism does not affect the snap distance previously established by the user. In this regard, even when the user zooms out, although the displayed grid may be rendered differently (e.g., by not displaying every third line or displaying less horizontal/perpendicular lines), the smaller unit used for the snapping is unchanged. Instead, the user must manually modify the snap to match up with the new grid spacing which further requires user knowledge of the exact grid spacing.

Alternative prior art systems may utilize legends, rulers, or scales to indicate the mapping/ratio between the distance in the drawing and a real world distance. A user may adjust a snap or grid value by modifying/dragging drag handles on the ruler/legend. In some embodiments, such legends/rulers/scales get smaller and smaller as the user zooms out. Alternatively, such a legend/ruler/scale may update with the zoom level. However, such an autoscaling legend/ruler/scale does not affect the user established grid/snap distance. Instead, the setting remains the same regardless of the level of zoom and the user is required to manually adjust the snap value if desired.

Alternative prior art systems provide for geographic mapping systems. Such systems allow the user to zoom in on a certain area of a map. However, such mapping systems merely load flat maps and provide the ability to zoom in and out. Mapping systems do not provide the ability for users to draw on the maps or snap when drawing a line or object. Further, such prior art methods merely load flat maps and are not working on the same drawing file.

Again, prior art systems fail to provide a mechanism that automatically and dynamically adjusts the snap/grid distance based on the user's desired work attributes. Instead, users are required to manually set a snap value through dialog boxes each time the user desires to change the snap distance. Accordingly, the user is required to move away from the designing area to change the snap distance. What is needed is an automated and efficient mechanism for adjusting the snap distance based on the user's desired viewing/work attributes in a dynamic manner.

SUMMARY OF THE INVENTION

One or more embodiments of the invention provide for an adaptive snap that automatically and dynamically adjusts a current snap increment value when a user adjusts the level of zoom (i.e., the zoom factor). In addition, an interactive snap legend allows the user to view and manipulate information about the snap increment value, the scale of the model at the current zoom level, the current units of a model, and the ability to change the units. Since a relationship exists between all of the elements in the interactive legend and the physical pixel space being used in a model, adjustment of one attribute may result in the automatic and dynamic adjustment (in real time) of other attributes. For example, if the unit system is changed, the scale of the model and the available increment values may change accordingly. Further, if the user zooms out/in, the scale may also change while maintaining the actual screen/pixel distance established for the snap/grid.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

One or more embodiments overcome the problems of the prior art and provide an adaptive snap that alleviates the user's need to adjust snap values. The adaptive snap adjusts depending on the user's interaction with the design.

Hardware Environment

Figure 1:
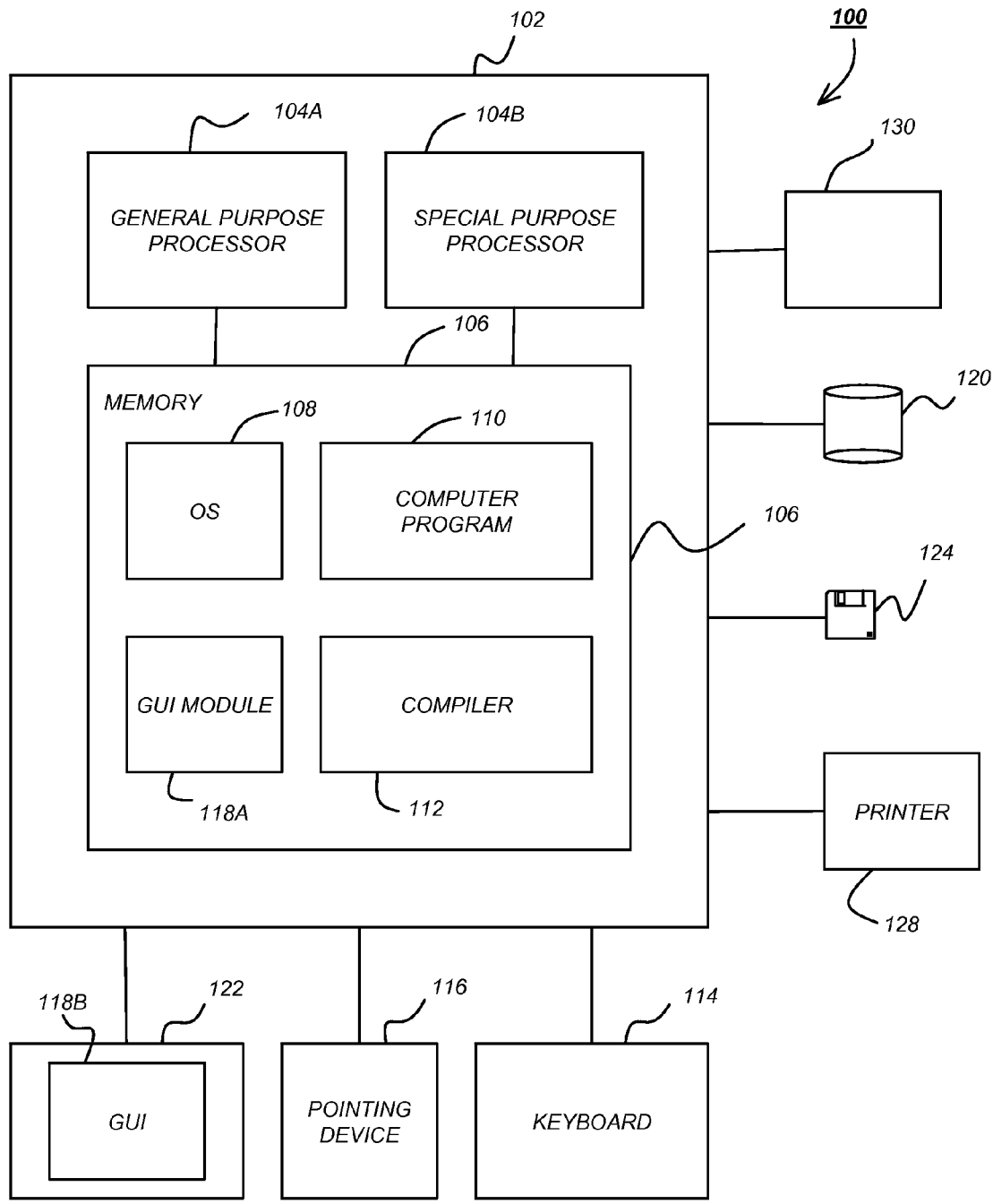
FIG. 1 is an exemplary hardware and software environment used to implement one or more embodiments of the invention.

FIG. 1 is an exemplary hardware and software environment 100 used to implement one or more embodiments of the invention. The hardware and software environment includes a computer 102 and may include peripherals. Computer 102 may be a user/client computer, server computer, or may be a database computer. The computer 102 comprises a general purpose hardware processor 104A and/or a special purpose hardware processor 104B (hereinafter alternatively collectively referred to as processor 104) and a memory 106, such as random access memory (RAM). The computer 102 may be coupled to other devices, including input/output (I/O) devices such as a keyboard 114, a cursor control device 116 (e.g., a mouse, a pointing device, pen and tablet, etc.) and a printer 128.

In one embodiment, the computer 102 operates by the general purpose processor 104A performing instructions defined by the computer program 110 under control of an operating system 108. The computer program 110 and/or the operating system 108 may be stored in the memory 106 and may interface with the user and/or other devices to accept input and commands and, based on such input and commands and the instructions defined by the computer program 110 and operating system 108 to provide output and results.

Output/results may be presented on the display 122 or provided to another device for presentation or further processing or action. In one embodiment, the display 122 comprises a liquid crystal display (LCD) having a plurality of separately addressable liquid crystals. Each liquid crystal of the display 122 changes to an opaque or translucent state to form a part of the image on the display in response to the data or information generated by the processor 104 from the application of the instructions of the computer program 110 and/or operating system 108 to the input and commands. The image may be provided through a graphical user interface (GUI) module 118A. Although the GUI module 118A is depicted as a separate module, the instructions performing the GUI functions can be resident or distributed in the operating system 108, the computer program 110, or implemented with special purpose memory and processors.

Some or all of the operations performed by the computer 102 according to the computer program 110 instructions may be implemented in a special purpose processor 104B. In this embodiment, the some or all of the computer program 110 instructions may be implemented via firmware instructions stored in a read only memory (ROM), a programmable read only memory (PROM) or flash memory within the special purpose processor 104B or in memory 106. The special purpose processor 104B may also be hardwired through circuit design to perform some or all of the operations to implement the present invention. Further, the special purpose processor 104B may be a hybrid processor, which includes dedicated circuitry for performing a subset of functions, and other circuits for performing more general functions such as responding to computer program instructions. In one embodiment, the special purpose processor is an application specific integrated circuit (ASIC).

The computer 102 may also implement a compiler 112 which allows an application program 110 written in a programming language such as COBOL, Pascal, C++, FORTRAN, or other language to be translated into processor 104 readable code. After completion, the application or computer program 110 accesses and manipulates data accepted from I/O devices and stored in the memory 106 of the computer 102 using the relationships and logic that was generated using the compiler 112.

The computer 102 also optionally comprises an external communication device such as a modem, satellite link, Ethernet card, or other device for accepting input from and providing output to other computers.

In one embodiment, instructions implementing the operating system 108, the computer program 110, and the compiler 112 are tangibly embodied in a computer-readable medium, e.g., data storage device 120, which could include one or more fixed or removable data storage devices, such as a zip drive, floppy disc drive 124, hard drive, CD-ROM drive, tape drive, etc. Further, the operating system 108 and the computer program 110 are comprised of computer program instructions which, when accessed, read and executed by the computer 102, causes the computer 102 to perform the steps necessary to implement and/or use the present invention or to load the program of instructions into a memory, thus creating a special purpose data structure causing the computer to operate as a specially programmed computer executing the method steps described herein. Computer program 110 and/or operating instructions may also be tangibly embodied in memory 106 and/or data communications devices 130, thereby making a computer program product or article of manufacture according to the invention. As such, the terms "article of manufacture," "program storage device" and "computer program product" as used herein are intended to encompass a computer program accessible from any computer readable device or media.

Of course, those skilled in the art will recognize that any combination of the above components, or any number of different components, peripherals, and other devices, may be used with the computer 102.

Although the term "user computer" or "client computer" is referred to herein, it is understood that a user computer 102 may include portable devices such as cell phones, notebook computers, pocket computers, or any other device with suitable processing, communication, and input/output capability.
Software Embodiments One or more embodiments of the invention may be implemented in computer program 110 as a computer graphics program. To overcome the problems of the prior art, such a program 110 enables an adaptive snap that alleviates the user's need to adjust snap values. The adaptive snap will automatically adjust such that when a user zooms in, the snap will switch to smaller snap increments and when the user zooms out, the snap will switch to larger snap increments. Such auto snapping is performed automatically and dynamically without additional user action required to update the snap increment. Further, the snap increment is adjusted on a basis that is appropriate to the context in which work is being performed. In other words, the snap increment is appropriate for the size and task that the user is performing without the user manually adjusting the snap increment.

One may note that users commonly utilize and/or desire a particular physical screen distance for utilization of a snap value (e.g., ½ thumb width). Such a desirable distance on a physical screen remains the same regardless of whether the snap increment represents 1 mm or 1 mile. However, as described above, when a user zooms in or out, the user still desires to utilize the same physical screen distance as a snap increment while having such a snap increment represent a different measurement value. For example, a user may desire a ½ thumb width physical screen distance to represent 3-4 feet when working on a space shuttle drawing while only ¼ of an inch on a cell phone drawing. Prior art software only utilizes a single snap value with a single unit system and a single numerical value. To adjust the snap value, the prior art requires the user to manually adjust a series of configurations. Embodiments of the present invention provide the ability to automatically adjust a snap value that is relevant to the particular user's context.

Figure 2:
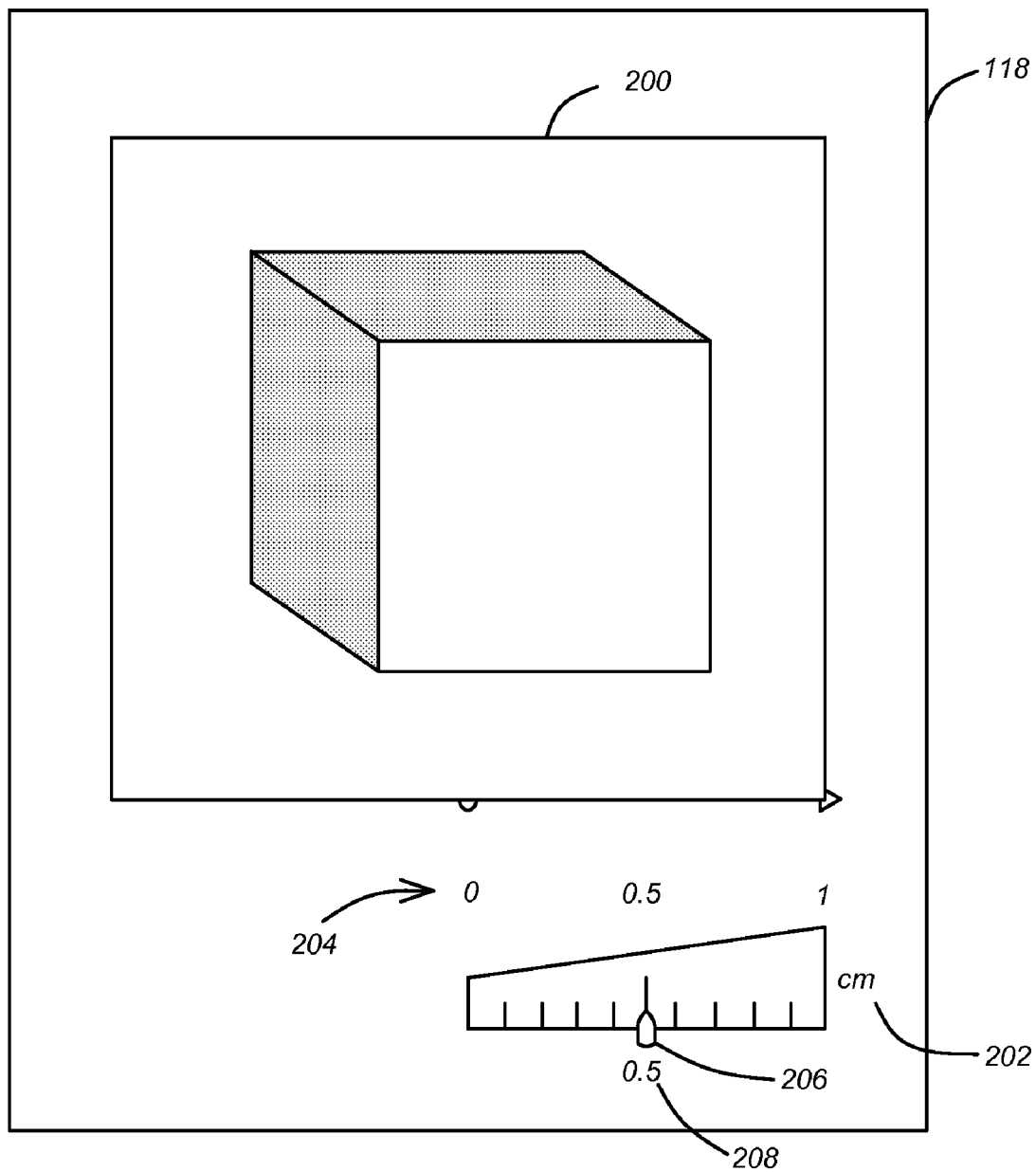
FIG. 2 illustrates an in-3D window display with a current unit system and provides an accurate representation of a unit scale relative to a model on the screen in accordance with one or more embodiments of the invention.

FIG. 2 illustrates an in-3D window display with the current unit system and provides an accurate representation of the unit scale relative to the model on the screen in accordance with one or more embodiments of the invention. As illustrated the GUI 118 contains the model/image 200 being edited/manipulated by the user. The current unit system 202 is illustrated as centimeters (cm). The scale for the model in the current view 204 illustrates the different increments from 0 to 0.5 to 1 that may be selected by the user. Such a scale 204 is based on and integrated with the current unit system 202 and will change based on the unit system 202. The different potential options are illustrated with hash marks with each hash mark representing a 0.1 increment for a base 10 metric unit of measure (that is based on the current centimeter unit system 202). The current snap value increment may be adjusted (e.g., by the user) using the slider 206 with the currently selected value indicated in textually at 208. As illustrated, the width of the model 200 is 2 cm at the current zoom level and in the current units 202. Thus, the user can directly alter the snap by adjusting the unit system 202 and slider 206.

The adaptive snap feature provides that when the user is working with large models, larger snap values are used and when working with smaller models, smaller snap values will be used. Further, working with metric units (e.g., millimeters) will use snaps in increments of tenths and working with Impirical/United States customary units (e.g., inches) will use snaps in increments of quarters, eighths, sixteenths, and thirty-seconds. Accordingly, embodiments adjust the snap value based on model size, view zoom, and the unit system 202.

Figure 3:
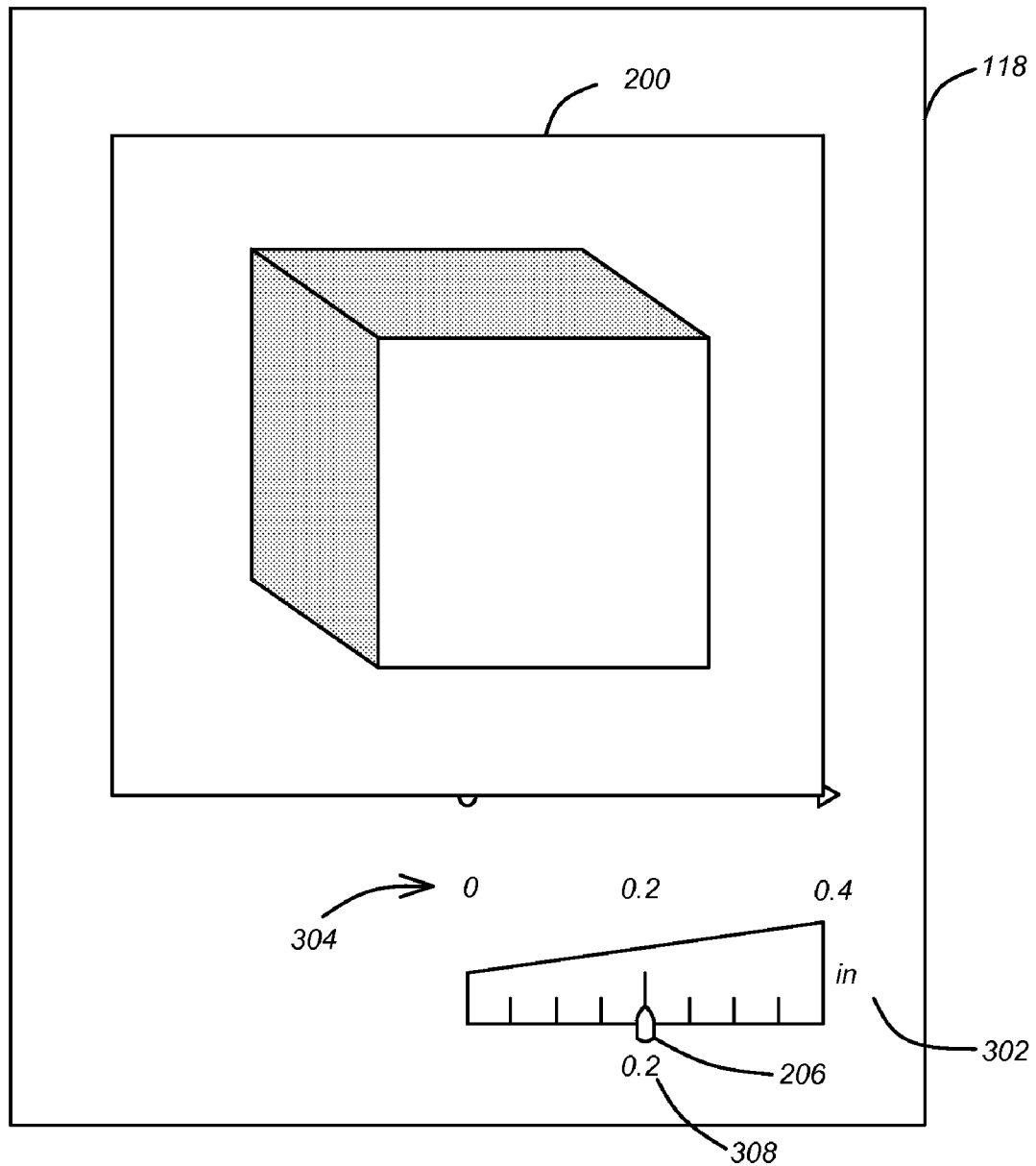
FIG. 3 illustrates the result of adjusting a unit system in accordance with one or more embodiments of the invention.

FIG. 3 illustrates the result of adjusting the unit system 202 in accordance with one or more embodiments of the invention. As illustrated, the current unit system 302 in FIG. 3 is set to an Impirical/United States customary unit with inches (in). Options for the different unit systems may include yards (yd), millimeters (mm), um (micrometer), mil, meters (m), inches (in), feet (ft), centimeters (cm), miles (mi), etc. Further, the available options may be presented to the user when the user clicks on the unit system 202/302. Such a presentation may be in the form of a list (that may be sorted e.g., from shortest to longest distances across the different units). Once the user changes the unit system (e.g., from centimeters 202 to inches 302), the snap value 208 automatically updates to the new unit 308 and this new value 308 is used during any further actions (e.g., extrusion, drawing, etc.). Thus, as illustrated, the snap scale changes from 0-1 mm to 0-0.4 inches. Further, the current snap value automatically changes to 0.2 inches to reflect a corresponding and desired snap value selection that has been rounded accordingly. In addition, the snap increments may change. FIG. 3 illustrates a change in the snap increments to ⅛ths which are used in the Impirical/United States customary system.

Once a given snap value 208/308 has been selected, when performing a drawing operation (e.g., extruding a shape, drawing a line, etc.), the shape will automatically snap in increments of the specified value 208/308. Thus, in FIG. 2, a user drawing a line in model 200 will extend/retract a line in increments of 0.5 cm. Similarly, while drawing a line in the model 200 of FIG. 3, the line will be extended/retracted in increments of 0.2 inches. Thus, if the user were to examine a measurement or textual representation of the length of an extrusion or line that is being drawn using the snap value 308 of FIG. 3, one may note that the value increases/decreases in increments of 0.2. Such calculations and displays are performed dynamically and automatically as the user is performing an operation.

Figure 4:
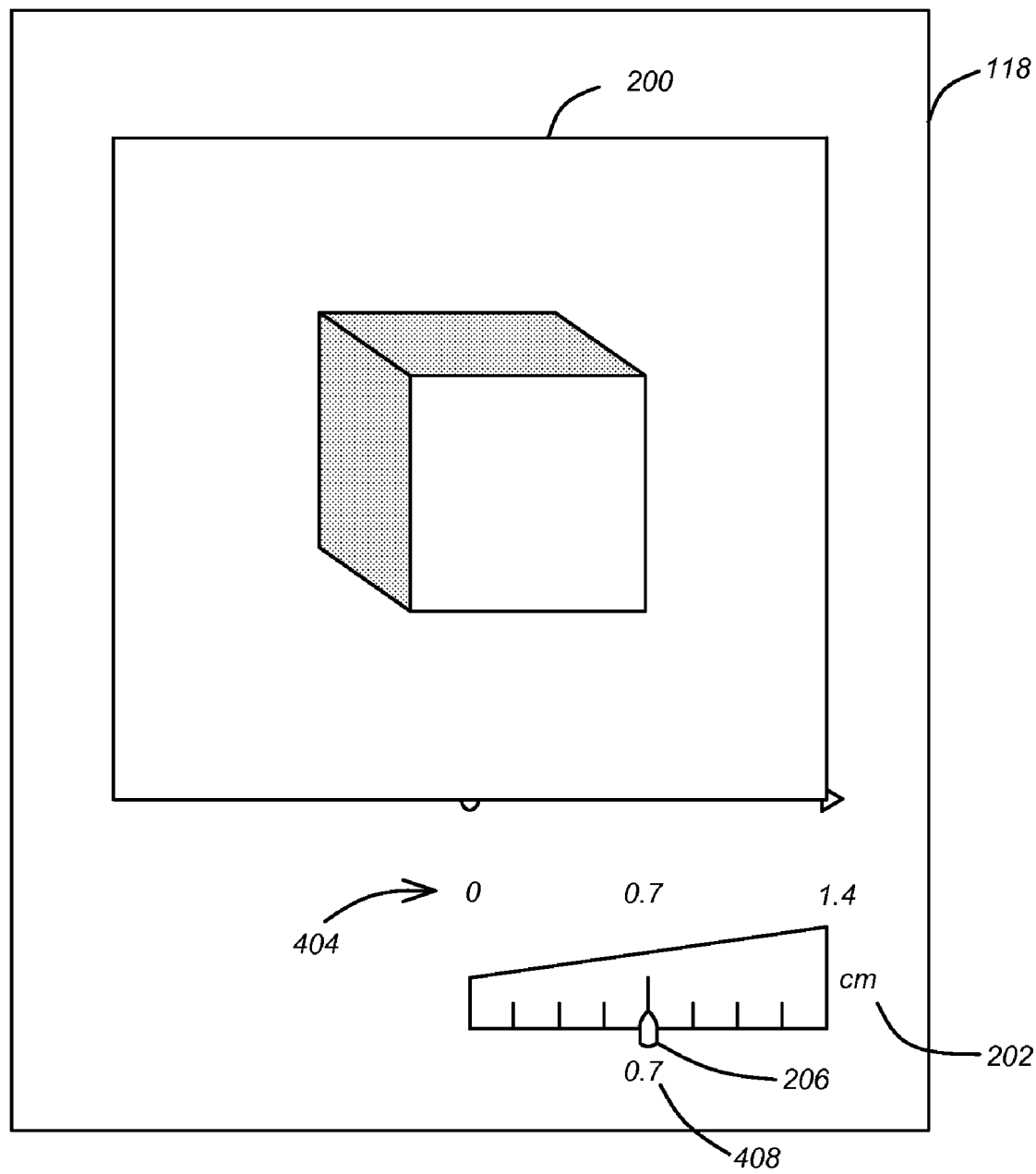
FIGS. 4 and 5 illustrate the effect of zooming out and a dynamically changing snap value and scale in accordance with one or more embodiments of the invention.
Figure 5:
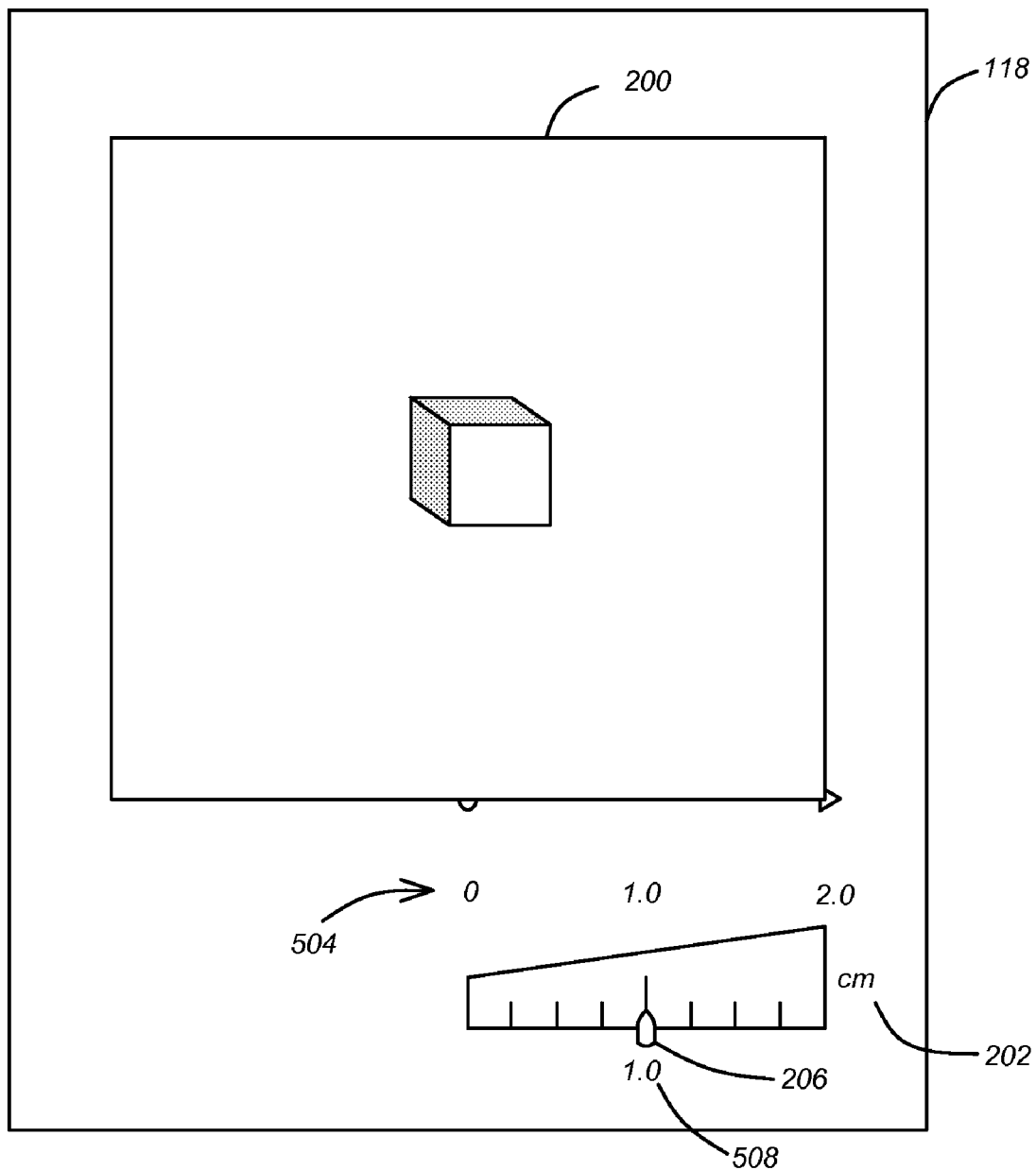

The snap value 208/308 and scale 204/304 that is used (and displayed) is based on the current level of zoom of the model 200. Referring again to FIG. 2, the current zoom level is established and the snap value 208 is set at 0.5 cm. As the user utilizes a different zoom level, the snap value 208 and scale 204 will automatically update to a different value and scale based on the zoom level. FIGS. 4 and 5 illustrate the effect of zooming out and a dynamically changing snap value 408/508 and scale 404/504 in accordance with one or more embodiments of the invention. As the user zooms out of the model 200 (i.e., the cube decreases in size as the user zooms out), the snap value will dynamically change (in real time as the user performs the zoom operation) to 0.7 (value 408 of FIG. 4) to 0.9, to 1.0 (value 508 of FIG. 5). Similarly, the scale will change from a max of 1 cm in scale 202 to 1.4 of scale 404, to 2.0 of scale 504.

Based on the above, it can be seen that when zooming out, it would be desirable to automatically increase (i.e., independently from and without additional user action) the current snap value 208-508 to enable the user to work in the now zoomed out model 200 using a desirable physical screen spacing (as the increment space) as established using the slider 206. Accordingly, once zoomed out as in FIG. 5, any modification of the model 200 (e.g., an extrusion of the cube) would be performed based on the 1.0 current snap value 508 that was automatically and dynamically established by the user.

In view of the above description, it can be seen that the invention enables numerous features/advantages including:

Automatic snapping without user intervention
An in-3D window heads up display showing:
    the current unit system;
    an accurate representation of unit scale relative to the model on the screen;
    the current snap value;
Facility to alter the snap value easily through the in-screen heads up display; and
Facility to alter the units easily through the in-screen heads up display.

Such a heads-up display allows the user to modify all of the above in one area without multiple independent actions.

Logical Flow

Figure 6:
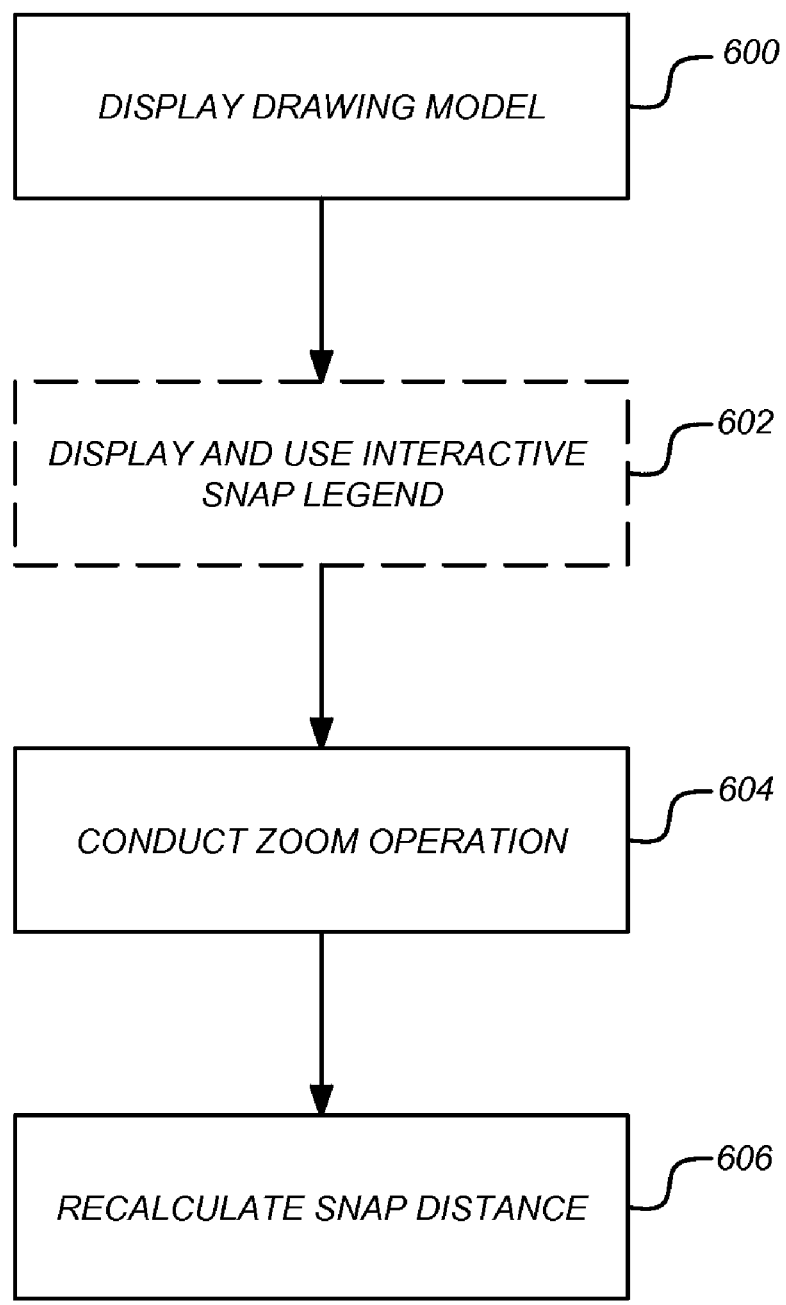
FIG. 6 illustrates the logical flow for positioning/manipulating an object in accordance with one or more embodiments of the invention.

FIG. 6 illustrates the logical flow for positioning/manipulating an object in accordance with one or more embodiments of the invention. At step 600, a drawing model is displayed on a display device. The drawing model has a snap option that enables a positioning of an object in alignment with grid lines by causing the object to automatically jump to an exact position when the object is moved to within a first snap distance (i.e., the current snap value) of the exact position. As used herein, such positioning also applies to the creation of an object or the modification of such an object. In this regard, the term "positioning" includes the modification of an object such as by extruding a surface or extending/drawing a line. In addition, the drawing model has a defined first zoom level.

Optional step 602 provides the ability to display and use an interactive snap legend (e.g., as illustrated in FIGS. 3-5). Such a snap legend graphically indicates the first snap distance (e.g., the current snap value 308/408/508), available options for alternative first snap distances (e.g., the hatch markings), and an interactive modifier (e.g., the slider 206 for adjusting the snap value 308/408/508) that modifies the first snap distance in response to user input. To use the interactive snap legend, the first snap distance (e.g., the current snap value 308/408/508) is modified in response to user input using the interactive modifier 206. Details relating to the use of the interactive legend are described in detail below with respect to FIG. 7.

At step 604, a zoom operation is conducted that changes the first zoom level to a second zoom level. In other words, the user zooms in to or out of the model 200.

At step 606, the first snap distance recalculated based on the second zoom level. Such a recalculation is performed automatically, dynamically, and independently from (e.g., without) additional user actions. Thus, when a user performs a zoom operation, the system may automatically adjust the current snap value 308/408/508 based on the new zoom level. To recalculate the current snap value, the current snap value is converted into a fixed number of pixels (i.e., the actual physical pixel space is measured to determine the user's desired physical screen/pixel distance for a snap increment). The amount of the zoom operation is then compared to the screen/pixel distance to determine a new snap distance to be used with the new zoom level. The available snap options (e.g., snap distance increments) may be adjusted as well as the actual current snap value 308/408/508. Further details relating to such calculations are discussed with respect to FIG. 7.

Figure 7:
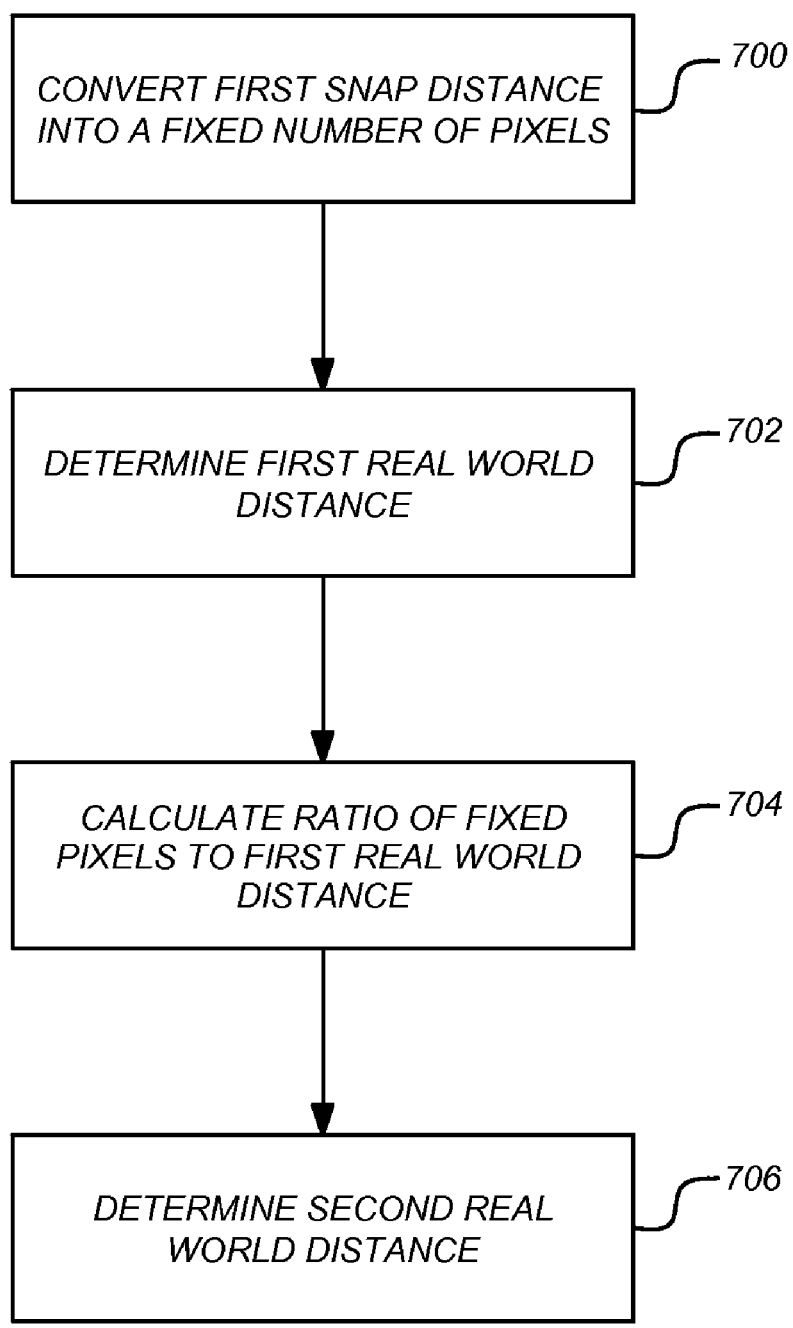
FIG. 7 illustrates the logical flow for calculating a new snap distance in accordance with one or more embodiments of the invention.

FIG. 7 illustrates the logical flow for calculating a new snap distance in accordance with one or more embodiments of the invention. At step 700, the first snap distance is converted into a fixed number of pixels (i.e., the actual physical screen space selected by a user as a snap increment/value).

At step 702, a first real world distance (of the drawing model) is determined based on the first zoom level. As noted above, available options for the alternative snap distances (e.g., the scale, different hatch patterns, and available snap values) are based on the first real world distance. Such a first real world distance essentially provides/defines a real world size for the extent of what is displayed. Such a first real world distance may be calculated/determined based on a three-dimensional (3D) world space position of a viewpoint within the drawing model and a field of view of the viewpoint. In such an implementation, one may imagine a camera placed into a 3D scene. The location and field of view of the camera (i.e., the camera's perspective of the 3D scene) is used to determine the real world distance for the scene being viewed.

At step 704, a ratio is calculated. The ratio is the fixed number of pixels to the first real world distance. This ratio establishes the relationship between the real world size to what is displayed on the display device.

At step 706, a second real world distance is determined based on the new/second zoom level. It may be noted that the recalculation of the first snap distance (i.e., of the current snap value) is based on this second real world distance and the ratio. In other words, once the ratio has been defined, the application can easily recalculate the new current snap value (i.e., the first snap distance) based on the amount of zoom applied and utilizing the ratio to perform the calculation. In embodiments of the invention, actual physical screen distance (i.e., number of pixels that is used to define the snap increment) does not change. Instead, actual screen distance remains the same (or relatively/approximately the same) while the current snap value and scale changes. Accordingly, the user's desired physical screen distance (e.g., ½ thumb width) is always utilized regardless of the zoom level and unit of measure.

In addition, the recalculated first snap distance (i.e., the current snap value) may be rounded to a logical value based on the second real world distance. In this regard, it is desirable to have rounded numbers compared to infinite or numbers with multiple decimals. For example, it is undesirable to have a current snap value of 21.11111. Instead, the number would be rounded to 21 (or 21.1 or to a number having a specified number of decimals). Further, the rounding will take the snap value as determined in real-world units and round the number to a value that makes sense for the unit system and the current zoom level. For example, if the real world distance (i.e., unit system) is a metric unit of measure, the recalculated snap distance may be rounded to logical values that are base 10. Alternatively, if the second real world distance is an inch based unit of measure (e.g., Impirical/United States customary units), the recalculated snap distance may be rounded logical values that are divided into eight (8) segments. Thus, the snap distance is logical depending on both the zoom factor/level, unit system, and real world distance of the scene.

Conclusion

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer implemented method for positioning an object in a computer drawing application comprising:
    (a) displaying, on a display device using a computer processor executing the computer drawing application, a drawing model, wherein:
        (i) the drawing model comprises a snap option;
        (ii) the snap option enables a positioning of an object in alignment with grid lines by causing the object to automatically jump to an exact position when the object is moved to within a first snap distance of the exact position; and
        (iii) the drawing model comprises a first zoom level;
    (b) conducting, using a computer processor executing the computer drawing application, a zoom operation that changes the first zoom level to a second zoom level; and
    (c) in response to the conducting, automatically, dynamically, and independently from additional user actions, recalculating the first snap distance based on the second zoom level.

2. The computer implemented method of claim 1, further comprising:
    (a) displaying, in the drawing model, an interactive snap legend that graphically indicates:
        (i) the first snap distance;
        (ii) available options for alternative first snap distances; and
        (iii) an interactive modifier that modifies the first snap distance in response to user input; and
    (b) modifying the first snap distance in response to user input using the interactive modifier.

3. The computer implemented method of claim 2 further comprising:
    (a) converting the first snap distance into a fixed number of pixels;
    (b) determining a first real world distance of the drawing model based on the first zoom level, wherein the available options for the alternative first snap distances are based on the first real world distance;
    (c) calculating a ratio of the fixed number of pixels to the first real world distance; and
    (d) determining a second real world distance based on the second zoom level, wherein the first snap distance is recalculated based on the second real world distance and the ratio.

4. The computer implemented method of claim 3, wherein the first real world distance is determined based on:
    (a) a three-dimensional (3D) world space position of a viewpoint within the drawing model; and
    (b) a field of view of the viewpoint.

5. The computer implemented method of claim 3 further comprising rounding the recalculated first snap distance to a logical value based on the second real world distance.

6. The computer implemented method of claim 5, wherein;
    (a) the second real world distance comprises a metric unit of measure; and
    (b) the recalculated snap distance is rounded to logical values that are base 10.

7. The computer implemented method of claim 5, wherein;
    (a) the second real world distance comprises an inch based unit of measure; and
    (b) the recalculated snap distance is rounded to logical values that are divided into 8 segments.

8. An apparatus for positioning an object in a computer drawing application in a computer system comprising:
    (a) a computer having a computer processor, a memory and a display device;
    (b) an application executed by the computer processor, wherein the application is configured to:
        (i) display, on the display device, a drawing model, wherein:
            (1) the drawing model comprises a snap option;
            (2) the snap option enables a positioning of an object in alignment with grid lines by causing the object to automatically jump to an exact position when the object is moved to within a first snap distance of the exact position; and
            (3) the drawing model comprises a first zoom level;
        (ii) conduct a zoom operation that changes the first zoom level to a second zoom level; and
        (iii) in response to the conduction of the zoom operation, automatically, dynamically, and independently from additional user actions, recalculate the first snap distance based on the second zoom level.

9. The apparatus of claim 8, wherein the application is further configured to:
    (a) display, in the drawing model, an interactive snap legend that graphically indicates:
        (i) the first snap distance;
        (ii) available options for alternative first snap distances; and
        (iii) an interactive modifier that modifies the first snap distance in response to user input; and
    (b) modify the first snap distance in response to user input using the interactive modifier.

10. The apparatus of claim 9, wherein the application is further configured to:
    (a) convert the first snap distance into a fixed number of pixels;
    (b) determine a first real world distance of the drawing model based on the first zoom level, wherein the available options for the alternative first snap distances are based on the first real world distance;
    (c) calculate a ratio of the fixed number of pixels to the first real world distance; and
    (d) determine a second real world distance based on the second zoom level, wherein the first snap distance is recalculated based on the second real world distance and the ratio.

11. The apparatus of claim 10, wherein the first real world distance is determined based on:
    (a) a three-dimensional (3D) world space position of a viewpoint within the drawing model; and
    (b) a field of view of the viewpoint.

12. The apparatus of claim 10, wherein the application is further configured to round the recalculated first snap distance to a logical value based on the second real world distance.

13. The apparatus of claim 12, wherein;
   (a) the second real world distance comprises a metric unit of measure; and
   (b) the recalculated snap distance is rounded to logical values that are base 10.

14. The apparatus of claim 12, wherein;
   (a) the second real world distance comprises an inch based unit of measure; and
   (b) the recalculated snap distance is rounded to logical values that are divided into 8 segments.

15. A non-transitory computer readable storage medium encoded with computer program instructions which when accessed by a computer cause the computer to load the program instructions to a memory therein creating a special purpose data structure causing the computer to operate as a specially programmed computer, executing a method of positioning an object, comprising:
   (a) displaying, on a display device, a drawing model, wherein:
      (i) the drawing model comprises a snap option;
      (ii) the snap option enables a positioning of an object in alignment with grid lines by causing the object to automatically jump to an exact position when the object is moved to within a first snap distance of the exact position; and
      (iii) the drawing model comprises a first zoom level;
   (b) conducting a zoom operation that changes the first zoom level to a second zoom level; and
   (c) in response to the conducting, automatically, dynamically, and independently from additional user actions, recalculating the first snap distance based on the second zoom level.

16. The computer readable storage medium of claim 15, the method further comprising:
   (a) displaying, in the drawing model, an interactive snap legend that graphically indicates:
      (i) the first snap distance;
      (ii) available options for alternative first snap distances; and
      (iii) an interactive modifier that modifies the first snap distance in response to user input; and
   (b) modifying the first snap distance in response to user input using the interactive modifier.

17. The computer readable storage medium of claim 16 the method further comprising:
   (a) converting the first snap distance into a fixed number of pixels;
   (b) determining a first real world distance of the drawing model based on the first zoom level, wherein the available options for the alternative first snap distances are based on the first real world distance;
   (c) calculating a ratio of the fixed number of pixels to the first real world distance; and
   (d) determining a second real world distance based on the second zoom level, wherein the first snap distance is recalculated based on the second real world distance and the ratio.

18. The computer readable storage medium of claim 17, wherein the first real world distance is determined based on:
   (a) a three-dimensional (3D) world space position of a viewpoint within the drawing model; and
   (b) a field of view of the viewpoint.

19. The computer readable storage medium of claim 17 the method further comprising rounding the recalculated first snap distance to a logical value based on the second real world distance.

20. The computer readable storage medium of claim 19, wherein;
   (a) the second real world distance comprises a metric unit of measure; and
   (b) the recalculated snap distance is rounded to logical values that are base 10.

21. The computer readable storage medium of claim 19, wherein;
   (a) the second real world distance comprises an inch based unit of measure; and
   (b) the recalculated snap distance is rounded to logical values that are divided into 8 segments.

* * * * *